(12) United States Patent
Wen et al.

(10) Patent No.: US 10,916,725 B2
(45) Date of Patent: Feb. 9, 2021

(54) ORGANIC LIGHT-EMITTING DIODE DISPLAY PANEL, METHOD FOR FABRICATING THE SAME AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Ping Wen, Beijing (CN); Ge Wang, Beijing (CN); Erjin Zhao, Beijing (CN); Jiang Xie, Beijing (CN); Zhiliang Jiang, Beijing (CN)

(73) Assignee: Chengdu BOE Optoelectronics Technology Co., Ltd., Chengdu (CN)

( * ) Notice: Subject to any disclaimer, the term of this patent is extended or adjusted under 35 U.S.C. 154(b) by 3 days.

(21) Appl. No.: 16/425,260

(22) Filed: May 29, 2019

(65) Prior Publication Data
US 2020/0075880 A1   Mar. 5, 2020

(30) Foreign Application Priority Data

Aug. 28, 2018   (CN) .......................... 2018 1 0987178

(51) Int. Cl.
*H01L 51/52* (2006.01)
*G06F 3/041* (2006.01)
(Continued)

(52) U.S. Cl.
CPC ........ *H01L 51/5203* (2013.01); *G06F 3/0412* (2013.01); *H01L 27/323* (2013.01);
(Continued)

(58) Field of Classification Search
CPC ............... H01L 51/5203; H01L 27/323; H01L 51/5262; H01L 27/3283; H01L 51/5246;
(Continued)

(56) References Cited

U.S. PATENT DOCUMENTS

2013/0147727 A1   6/2013 Lee et al.
2016/0328039 A1*  11/2016 Lin ....................... G06F 3/0446

FOREIGN PATENT DOCUMENTS

CN      103151467 A    6/2013
CN      105489634 A    4/2016
(Continued)

OTHER PUBLICATIONS

Chinese Office Action dated Nov. 25, 2019 for corresponding application CN 201810987178.8.

*Primary Examiner* — Patricia D Reddington
(74) *Attorney, Agent, or Firm* — Arent Fox LLP; Michael Fainberg

(57) ABSTRACT

An organic light-emitting diode display panel, a method for fabricating the same and a display device are provided. The display panel is divided into a visible area and a non-display area, and includes: a base substrate, a plurality of organic light-emitting diode elements on the base substrate, an encapsulation layer on sides of the organic light-emitting diode elements away from the base substrate, a touch electrode layer on the side of the encapsulation layer away from the organic light-emitting diode elements, a peripheral circuit on the touch electrode layer away from the encapsulation layer, a circular polarizer on the sides of the touch electrode layer and the peripheral circuit away from the encapsulation layer, and an adhesive layer between the touch electrode layer and the circular polarizer.

10 Claims, 6 Drawing Sheets

(51) Int. Cl.
  *H01L 27/32*    (2006.01)
  *G06F 3/044*    (2006.01)

(52) U.S. Cl.
  CPC ........ *H01L 51/5262* (2013.01); *G06F 3/0416* (2013.01); *G06F 3/0445* (2019.05)

(58) Field of Classification Search
  CPC ............. H01L 51/5253; H01L 51/5275; G06F 3/0412; G06F 2203/04103; G06F 3/0445; G06F 3/0416
  See application file for complete search history.

(56)             References Cited

FOREIGN PATENT DOCUMENTS

| | | |
|---|---|---|
| CN | 105988154 A | 10/2016 |
| CN | 106783923 A | 5/2017 |
| CN | 108281387 A | 7/2018 |

\* cited by examiner

ORGANIC LIGHT-EMITTING DIODE DISPLAY PANEL, METHOD FOR FABRICATING THE SAME AND DISPLAY DEVICE

CROSS-REFERENCES TO RELATED APPLICATION

This application claims priority to Chinese patent application No. 201810987178.8 filed on Aug. 28, 2018, which is incorporated herein by reference in its entirety.

FIELD

The present disclosure relates to the field of display technologies, and particularly to an organic light-emitting diode display panel, a method for fabricating the same, and a display device.

BACKGROUND

An Organic Light-Emitting Diode (OLED) display panel has been widely favored in the field of display technologies because no backlight source is needed, and it has high contrast, a small thickness, a wide angle of view, a high response speed, a wide range of operating temperatures, and other excellent characteristics. After an Organic Light-Emitting Diode (OLED) touch and display panel is fabricated, touch elements and their associated circuits are formed directly on the display panel, and finally a circular polarizer is adhered to the outside thereof to thereby reduce ambient light reflection.

However in the related art, the circular polarizer can not be completely adhered to the display panel due to the presence of a peripheral circuit of the touch elements, resulting in a gap may at the edge of a visible area, and causing the display panel to leak light.

SUMMARY

In one aspect, an embodiment of the disclosure provides an organic light-emitting diode display panel. The organic light-emitting diode display panel is divided into a visible area, and a non-display area around the visible area. The organic light-emitting diode display panel includes: a base substrate, a plurality of organic light-emitting diode elements on the base substrate, an encapsulation layer on sides of the organic light-emitting diode elements away from the base substrate, a touch electrode layer on a side of the encapsulation layer away from the organic light-emitting diode elements, and a peripheral circuit on a side of the touch electrode layer away from the encapsulation layer, wherein the organic light-emitting diode elements are only located in the visible area, and the peripheral circuit is only located in the non-display area; and the organic light-emitting diode display panel further includes: a circular polarizer on the sides of the touch electrode layer and the peripheral circuit away from the encapsulation layer, and an adhesive layer between the touch electrode layer and the circular polarizer, wherein the touch electrode layer is firmly adhered with the circular polarizer through the adhesive layer.

In a possible implementation, in the organic light-emitting diode display panel above according to the embodiment of the disclosure, a thickness of the adhesive layer at an edge of the visible area increases gradually in a direction from the edge of the visible area to the non-display area.

In a possible implementation, in the organic light-emitting diode display panel above according to the embodiment of the disclosure, a material of the adhesive layer is an optically clear adhesive or a pressure sensitive adhesive.

In a possible implementation, in the organic light-emitting diode display panel above according to the embodiment of the disclosure, the adhesive layer includes: a first adhesive layer and a second adhesive layer stacked over each other, wherein the first adhesive layer is between the touch electrode layer and the second adhesive layer; and a thickness of the first adhesive layer is equal to the thickness of the peripheral circuit, orthographic projections of the first adhesive layer and the peripheral circuit on the base substrate are complement to each other, and an orthographic projection of the second adhesive layer on the base substrate covers the orthographic projections of the first adhesive layer and the peripheral circuit on the base substrate.

In a possible implementation, in the organic light-emitting diode display panel above according to the embodiment of the disclosure, a material of the first adhesive layer is an optically clear adhesive, and a material of the second adhesive layer is a pressure sensitive adhesive.

In another aspect, an embodiment of the disclosure provides a display device including the organic light-emitting diode display panel according to any one of the technical solutions above.

In another aspect, an embodiment of the disclosure provides a method for fabricating an organic light-emitting diode display panel. The method includes: forming a plurality of organic light-emitting diode elements on a base substrate; forming an encapsulation layer on sides of the organic light-emitting diode elements away from the base substrate; forming a touch electrode layer on a side of the encapsulation layer away from the organic light-emitting diode elements; forming a peripheral circuit on a side of the touch electrode layer away from the encapsulation layer; forming an adhesive layer on surfaces of the touch electrode layer and the peripheral circuit away from the encapsulation layer; and adhering a circular polarizer to a surface of the adhesive layer away from the touch electrode layer, wherein the organic light-emitting diode display panel is divided into a visible area, and a non-display area around the visible area; and the organic light-emitting diode elements are only located in the visible area, and the peripheral circuit is only located in the non-display area; and the touch electrode layer is firmly adhered with the circular polarizer through the adhesive layer in the visible area.

In a possible implementation, in the fabricating method above according to the embodiment of the disclosure, the thickness of the adhesive layer at the edge of the visible area increases gradually in the direction from the edge of the visible area to the non-display area.

In a possible implementation, in the fabricating method above according to the embodiment of the disclosure, forming the adhesive layer on the surfaces of the touch electrode layer and the peripheral circuit away from the encapsulation layer includes: forming a first adhesive layer on a surface of the touch electrode layer away from the encapsulation layer, wherein the thickness of the first adhesive layer is equal to the thickness of the peripheral circuit, and orthographic projections of the first adhesive layer and the peripheral circuit on the base substrate are complement to each other; and forming the second adhesive layer on the surfaces of the first adhesive layer and the peripheral circuit away from the touch electrode layer, wherein an orthographic projection of the second adhesive layer on the base substrate covers the orthographic projections of the first adhesive layer and the peripheral circuit on the base substrate.

In a possible implementation, in the fabricating method above according to the embodiment of the disclosure, the material of the first adhesive layer is an optically clear adhesive, and the material of the second adhesive layer is a pressure sensitive adhesive.

DETAILED DESCRIPTION

The embodiments of the disclosure provide an organic light-emitting diode display panel, a method for fabricating the same, and a display device, so as to eliminate a gap between a circular polarizer and the display panel in a visible area and thereby improve the display quality.

In order to make the objects, technical solutions, and advantages of the disclosure more apparent, the disclosure will be described below in further details with reference to the drawings. Apparently the embodiments to be described are only a part but not all of the embodiments of the disclosure. Based upon the embodiments here of the disclosure, all of other embodiments which can occur to those ordinarily skilled in the art without any inventive effort shall come into the scope of the disclosure as claimed.

An organic light-emitting diode display panel, a method for fabricating the same, and a display device according to particular embodiments of the disclosure will be described below in details with reference to the drawings.

Figure 1:
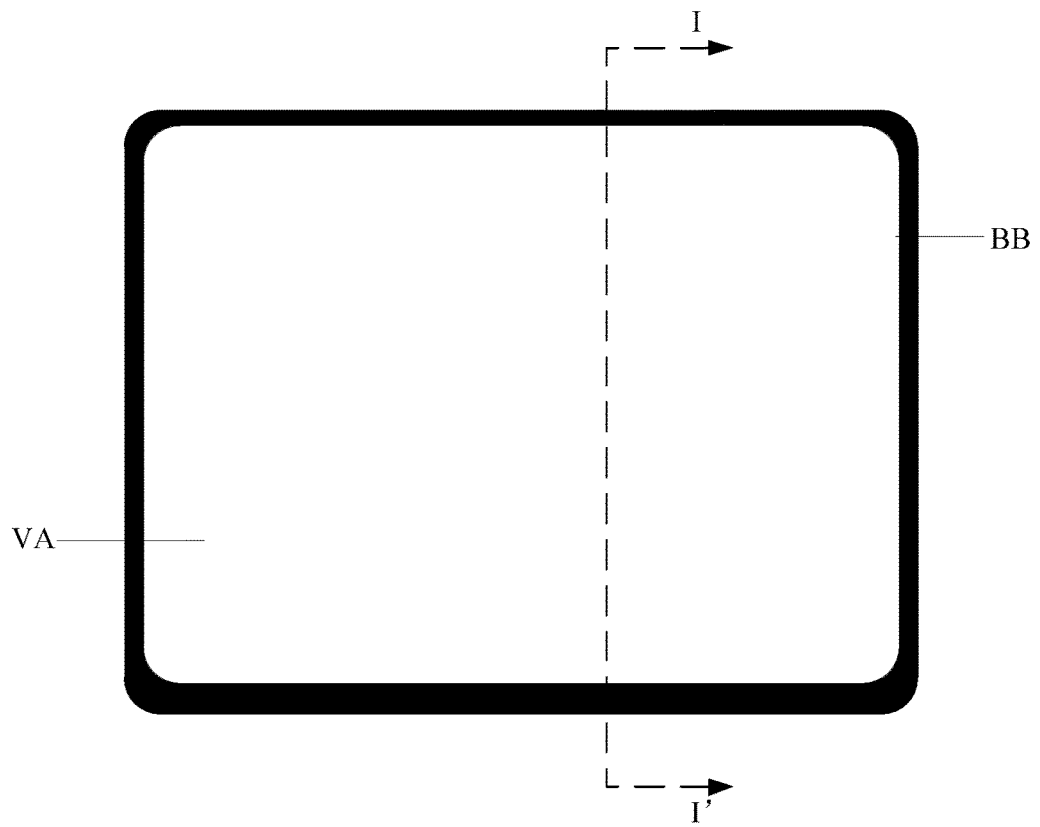
FIG. 1 is a schematic structural diagram of an organic light-emitting diode display panel according to an embodiment of the disclosure in a top view.
Figure 2:
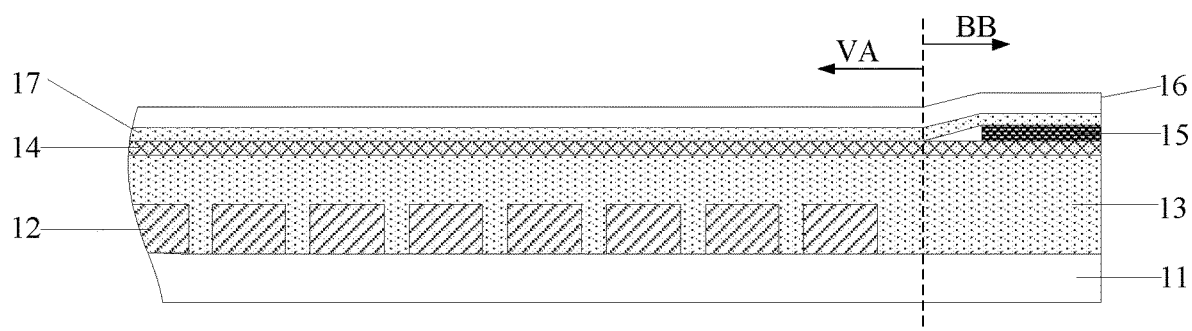
FIG. 2 is a first schematic structural diagram of the organic light-emitting diode display panel in a sectional view taken along II' in FIG. 1.

As illustrated in FIG. 1, an organic light-emitting diode display panel according to an embodiment of the disclosure can be divided into a visible area VA, and a non-display area BB around the visible area. FIG. 2 illustrates a schematic structural diagram of the organic light-emitting diode display panel in a sectional view taken along II' in FIG. 1.

As illustrated in FIG. 2, the organic light-emitting diode display panel above according to the embodiment of the disclosure includes: a base substrate 11, a plurality of organic light-emitting diode elements 12 located on the base substrate 11, an encapsulation layer 13 located on the side of the organic light-emitting diode elements 12 away from the base substrate 11, a touch electrode layer 14 located on the side of the encapsulation layer 13 away from the the organic light-emitting diode elements 12, and a peripheral circuit 15 located on the touch electrode layer 14 away from the encapsulation layer 13, where the organic light-emitting diode elements 12 are only located in the visible area VA, and the peripheral circuit 15 is only located in the non-display area BB.

Furthermore the organic light-emitting diode display panel further includes: a circular polarizer 16 located on the sides of the touch electrode layer 14 and the peripheral circuit 15 away from the encapsulation layer 13, and an adhesive layer 17 located between the touch electrode layer 14 and the circular polarizer 16, where the touch electrode layer 14 is firmly adhered with the circular polarizer 16 through the adhesive layer 17.

In a specific implementation, the peripheral circuit 15 configured to control various touch electrodes at the touch electrode layer is formed in the non-display area BB of the organic light-emitting diode display panel so that the surface of the display panel is not flat, so when the circular polarizer 16 is adhered firmly to the surface of the touch electrode layer 14, then there may be a gap at the edge of the visible area VA. Accordingly in the embodiment of the disclosure, the adhesive layer is made of an adhesive material with a higher viscosity grade, so that the circular polarizer can be firmly adhered with the touch electrode layer 14 in a large area without any gap or air bubble in the visible area VA and at the edge of the visible area VA, to thereby avoid light leakage of the display panel, so as to improve the display quality.

Figure 3:
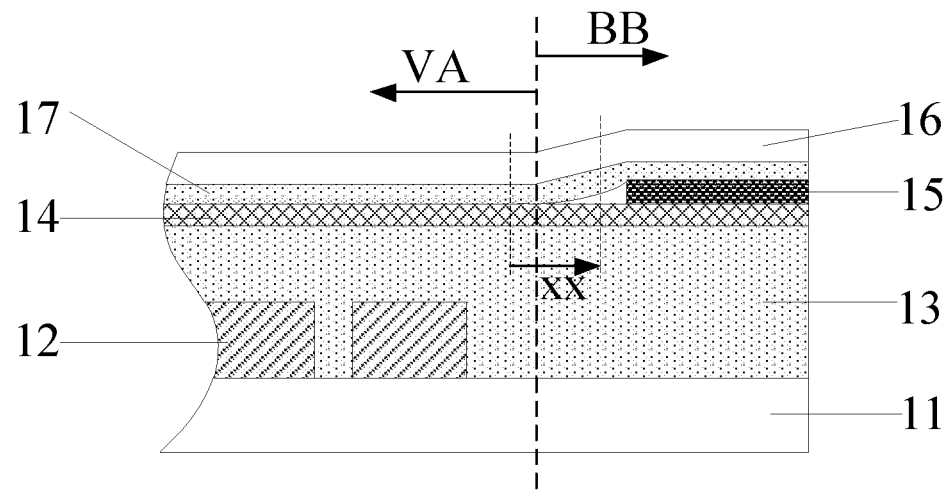
FIG. 3 is a second schematic structural diagram of the organic light-emitting diode display panel according to the embodiment of the disclosure in a sectional view.

In some embodiments, the rigidity of the material of the adhesive layer can be lowered to thereby improve the fluidity of the material, and when the adhesive layer is made of such a material, as illustrated in FIG. 3, when the adhesive material is coated to a stepped area near the peripheral circuit, then adhesive layer can fill the stepped area to some extent due to its large fluidity, so that the thickness of the adhesive layer at the edge of the visible area (in the area "xx" as illustrated in FIG. 3) increases gradually in the direction from the edge of the visible area to the non-display area (i.e., in the direction denoted by the arrow in the area "xx"), so an inter-layer gap which would otherwise have occurred in the visible area is filled with the adhesive material, and thus there can be no gap or air bubble at the edge of the visible area, thus avoiding light leakage out of the display panel, and improving the display quality. In a specific implementation, the coating speed of the adhesive layer can be lowered in the stepped area above so that the adhesive layer is further coated toward the peripheral circuit after the stepped area is filled up therewith, and in this way, the risk of an inter-layer gap and air bubble can be further lowered.

In some embodiments, the material of the adhesive layer 17 can be an Optically Clear Adhesive (OCA) or a Pressure Sensitive Adhesive (PSA). The PSA is an adhesive sensitive to a pressure. This adhesive has such a high adhesion that even the adhesive with a small thickness can have a smaller stripping force than a bonding force between the adhesive and a base material, so the adhesive layer is made of this adhesive material to adhere the circular polarizer; and components of the PSA can be modified, and the surface of the PSA can be treated as appropriate, to thereby improve the adhesion of the PSA, so that the bonding force between the circular polarizer, and the display panel on which the circular polarizer is adhered can be improved while avoiding a gap and an air bubble from occurring in the visible area. The OCA is colorless and transparent, has an optical transmittivity up to 90%, and a high adhesion strength, and can be cured at room or moderate temperature; and when the adhesive layer is made of the OCA, then the optical transmittivity of the display panel cannot be affected in addition to the effect above. Additionally the adhesive layer can alternatively be made of another adhesive material in a real application as long as the other adhesive material as conceived without departing from the spirit of the disclosure can be applicable to the organic light-emitting diode display panel above according to the embodiment of the disclosure, so the embodiment of the disclosure will not be limited thereto.

Figure 4:
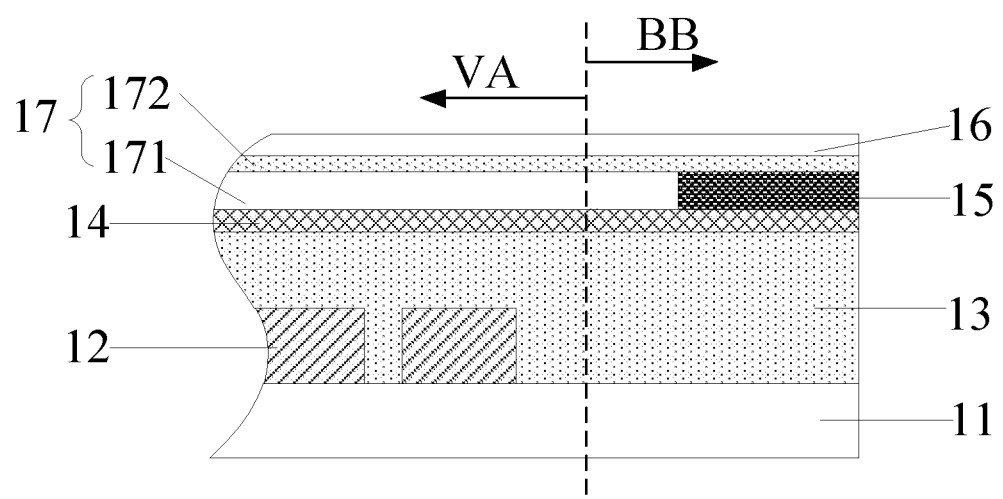
FIG. 4 is a third schematic structural diagram of the organic light-emitting diode display panel according to the embodiment of the disclosure in a sectional view.

In some embodiments, as illustrated in FIG. 4, the adhesive layer 17 can include: a first adhesive layer 171 and a second adhesive layer 172 stacked over each other, where the first adhesive layer 171 is located between the touch electrode layer 14 and the second adhesive layer 172, the thickness of the first adhesive layer 171 is equal to the thickness of the peripheral circuit 15, orthographic projections of the first adhesive layer 171 and the peripheral circuit 15 on the base substrate are complement to each other, and an orthographic projection of the second adhesive layer 172 on the base substrate covers the orthographic projections of the first adhesive layer 171 and the peripheral circuit 15 on the base substrate.

A gap between the circular polarizer and the display panel arises from some height of the subsequently formed peripheral circuit, so in this embodiment, firstly the difference in height in the display panel is filled up with the first adhesive layer 171, and there is no gap between the first adhesive layer 171 and the peripheral circuit 15; and then the entire second adhesive layer is formed on the first adhesive layer 171 and the peripheral circuit 15, and the entire flat OLED display panel is bonded with the circular polarizer 16 through the second adhesive layer 172, so a gap or an air bubble between the layers can be avoided to thereby improve the quality of imaging on the display panel.

In a specific implementation, the first adhesive layer 171 can be made of an optically clear adhesive with a high optical transmittivity to thereby make the surface of the display panel to be flat, and in this way, the upper surface of the first adhesive layer 171 is adhesive, so the circular polarizer can be firmly fit on the display panel simply by further forming the second adhesive layer 172 with a small thickness. The second adhesive layer 172 can be made of a pressure sensitive adhesive, or the first adhesive layer 171 can alternatively be made of a pressure sensitive adhesive, and the second adhesive layer 172 can be made of an optically clear adhesive, or both of the layers can alternatively be made of the same one of them or another adhesive material, although the embodiment of the disclosure will not be limited thereto.

Based upon the same inventive idea, an embodiment of the disclosure further provides a display device including the organic light-emitting diode display panel according to any one of the embodiments above of the disclosure. The display device can be an OLED display screen, an OLED display, an OLED TV set, or another display device, or can be a mobile phone, a tablet computer, a smart album, or another mobile device. Since the display device addresses the problem under a similar principle to the organic light-emitting diode display panel above, reference can be made to the implementation of the organic light-emitting diode display panel above for an implementation of the display device, so a repeated description thereof will be omitted here.

Figure 5:
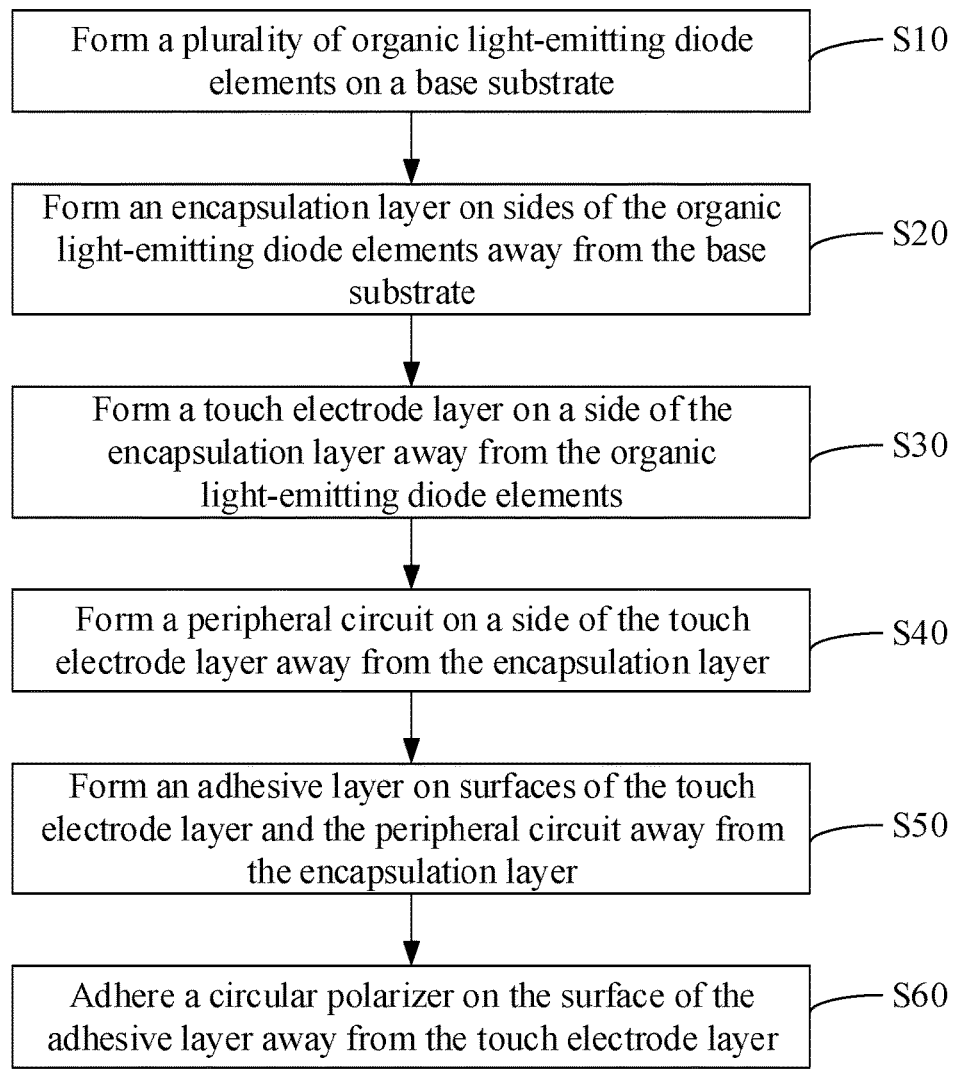
FIG. 5 is a first flow chart of a method for fabricating an organic light-emitting diode display panel according to an embodiment of the disclosure.

In another aspect, an embodiment of the disclosure further provides a method for fabricating the organic light-emitting diode display panel above, and as illustrated in FIG. 5, a method for fabricating an organic light-emitting diode display panel according to an embodiment of the disclosure includes the following steps.

The step S10 is to form a plurality of organic light-emitting diode elements on a base substrate.

The step S20 is to form an encapsulation layer on the sides of the organic light-emitting diode elements away from the base substrate.

The step S30 is to form a touch electrode layer on the side of the encapsulation layer away from the organic light-emitting diode elements.

The step S40 is to form a peripheral circuit on the side of the touch electrode layer away from the encapsulation layer.

The step S50 is to form an adhesive layer on surfaces of the touch electrode layer and the peripheral circuit away from the encapsulation layer.

The step S60 is to adhere a circular polarizer to the surface of the adhesive layer away from the touch electrode layer.

The organic light-emitting diode display panel is divided into a visible area VA, and a non-display area BB around the visible area; and the various organic light-emitting diode elements are only located in the visible area, and the peripheral circuit is only located in the non-display area.

The touch electrode layer is firmly adhered with the circular polarizer through the adhesive layer in the visible area.

Figure 6A:
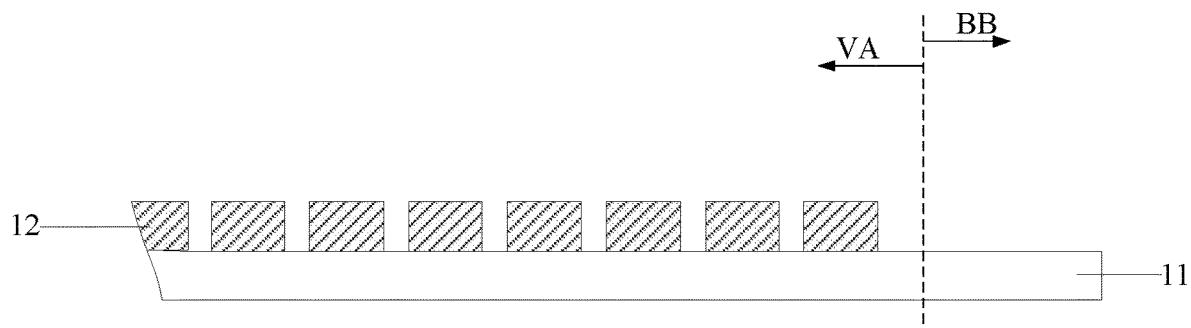
FIG. 6A to FIG. 6F are effect diagrams of the organic light-emitting diode display panel corresponding to various steps in the method as illustrated in FIG. 5.
Figure 6B:
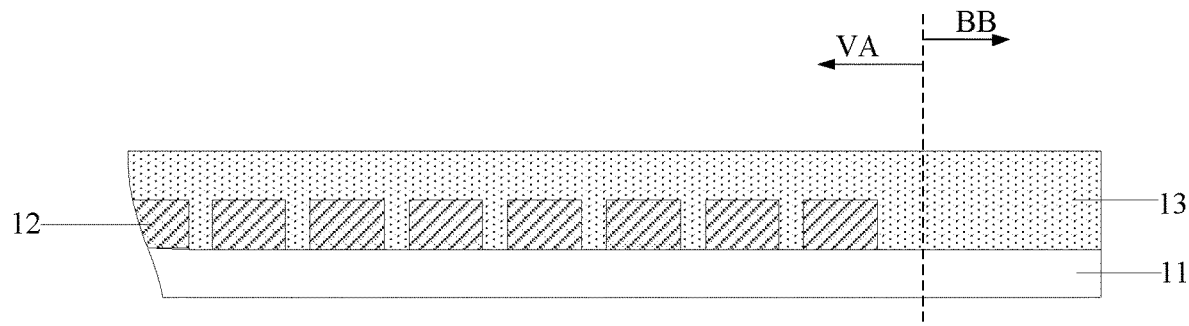
Figure 6C:
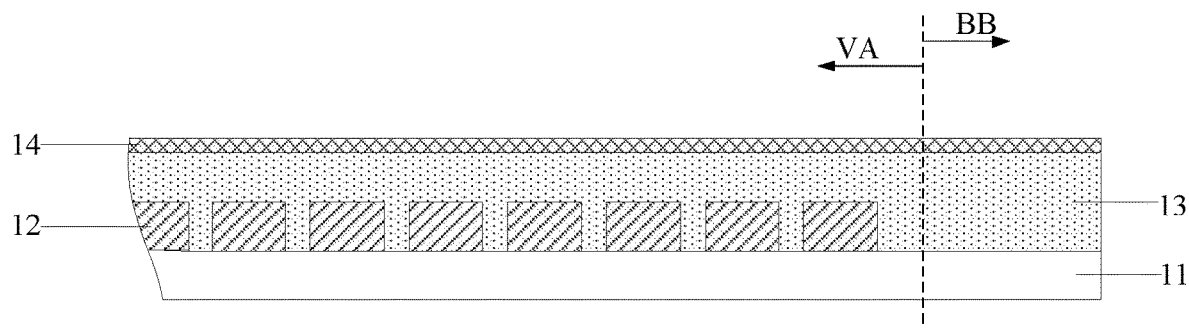
Figure 6D:
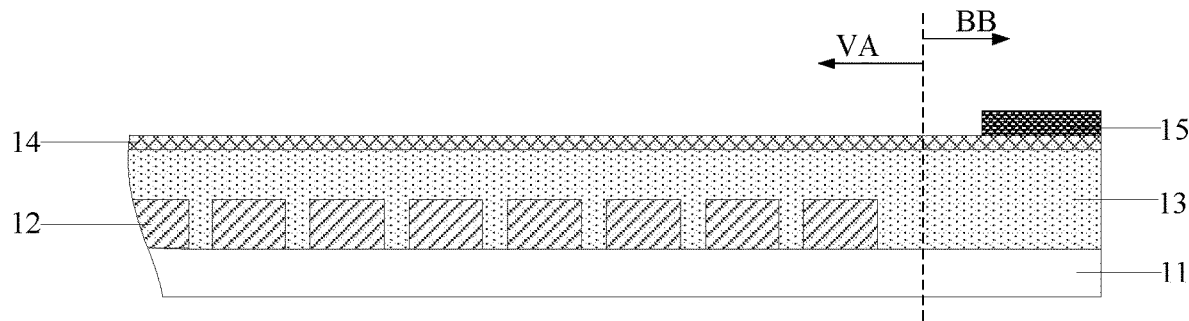
Figure 6E:
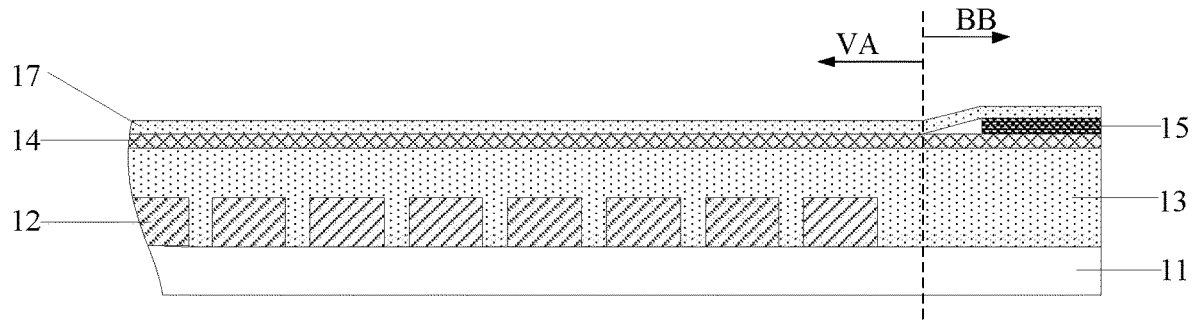
Figure 6F:
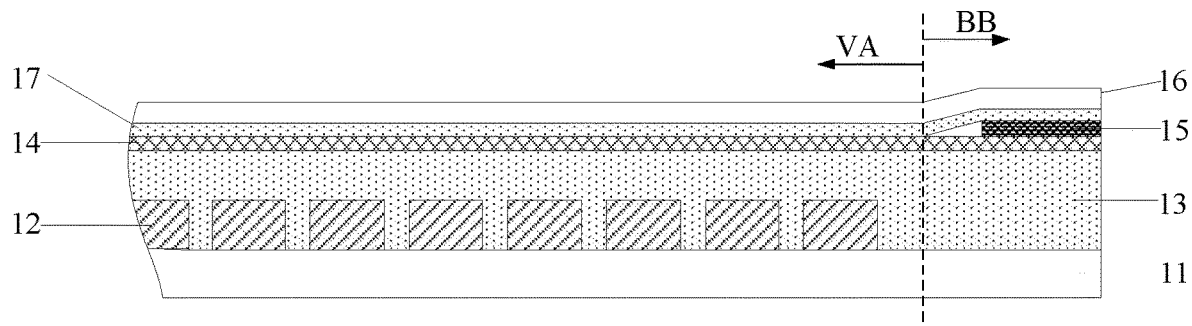

FIG. 6A to FIG. 6F are effect diagrams of the organic light-emitting diode display panel corresponding to the various steps in the method as illustrated in FIG. 5. Specifically as illustrated in FIG. 6A, firstly a plurality of organic light-emitting diode elements 12 arranged in an array can be formed on the base substrate 11, where each organic light-emitting diode element 12 can include an anode, a light-emitting layer, and a cathode stacked over each other, and typically firstly a plurality of block anodes can be formed on the base substrate 11, and an integral light-emitting layer can be formed on the anodes, and then an integral cathode layer can be formed on the light-emitting layer. Next as illustrated in FIG. 6B, in the embodiment of the disclosure, the formed organic light-emitting diode elements 12 can be encapsulated by forming the integral encapsulation layer 13 as a closed thin film, to thereby block ambient water and oxygen from entering the display panel, and thus eroding the organic light-emitting material therein. When the organic light-emitting diode display panel is provided with a touch function, as illustrated in FIG. 6C, touch electrodes can be formed directly on the surface of the encapsulation layer 13 to thereby form the touch electrode layer 14, and the touch electrodes shall be connected with the peripheral circuit 15 in the non-display area through touch lines as illustrated in FIG. 6D, where the peripheral circuit can be a flexible circuit occupying some space of a bezel of the display panel, so that the surface of the display panel also becomes not flat, thus hindering the circular polarizer from being adhering. In view of this, after the touch electrode layer 14 and the peripheral circuit 15 are formed, as illustrated in FIG. 6E, the integral adhesive layer 17 is formed on their surfaces, where the adhesive layer can be made of an adhesive material with a high viscosity grade, so that as illustrated in FIG. 6F, the circular polarizer can be firmly adhered with the touch electrode layer 14 in a large area without any gap or air bubble in the visible area VA and at the edge of the visible area VA, to thereby avoid light from being leaked out of the display panel, so as to improve the display quality.

In some embodiments, the rigidity of the material of the adhesive layer can be lowered to thereby improve the fluidity of the material, and when the adhesive layer is made of such a material, the adhesive layer can flow toward the stepped area between the touch electrode layer and the peripheral circuit at their interface, so that the thickness of the adhesive layer at the edge of the visible area increases gradually in the direction from the edge of the visible area to the non-display area, so an inter-layer gap which would otherwise have occurred in the visible area is filled with the adhesive material, and thus there can be no gap or air bubble at the edge of the visible area, thus avoiding light from being leaked out of the display panel, and improving the display quality.

Figure 7:
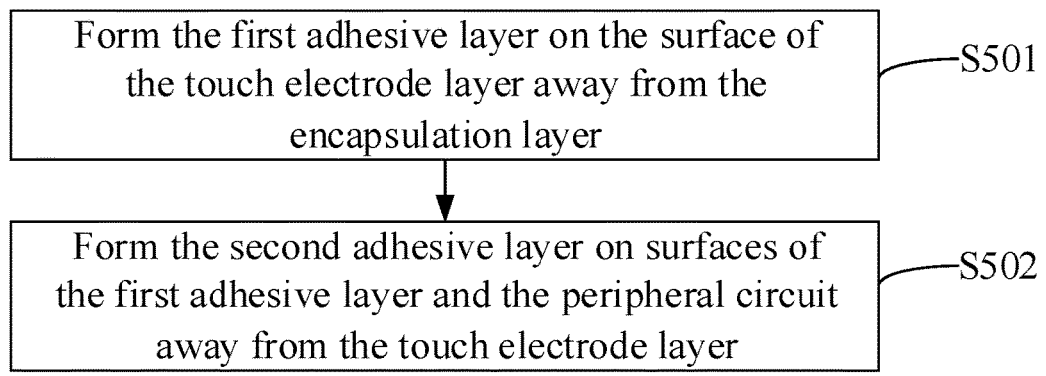
FIG. 7 is a second flow chart of a method for fabricating an organic light-emitting diode display panel according to an embodiment of the disclosure.

In some embodiments, the step S50 above of forming the adhesive layer on the surfaces of the touch electrode layer and the peripheral circuit away from the encapsulation layer can specifically include the following sub-steps as illustrated in FIG. 7.

S501 is to form the first adhesive layer on the surface of the touch electrode layer away from the encapsulation layer.

S502 is to form the second adhesive layer on the surfaces of the first adhesive layer and the peripheral circuit away from the touch electrode layer.

Here the thickness of the first adhesive layer is equal to the thickness of the peripheral circuit, orthographic projections of the first adhesive layer and the peripheral circuit on the base substrate are complement to each other, and an orthographic projection of the second adhesive layer on the base substrate covers the orthographic projection of the first adhesive layer and the peripheral circuit on the base substrate.

Figure 8A:
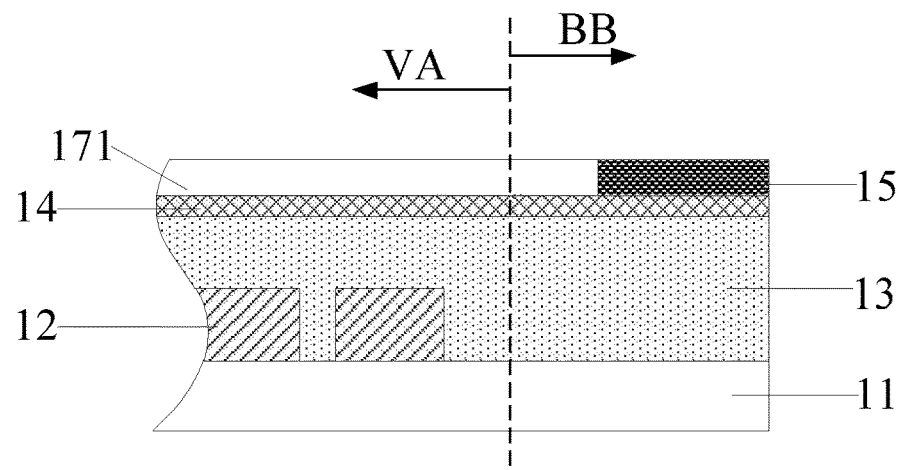
FIG. 8A to FIG. 8C are effect diagrams of the organic light-emitting diode display panel corresponding to various steps in the method as illustrated in FIG. 7.
Figure 8B:
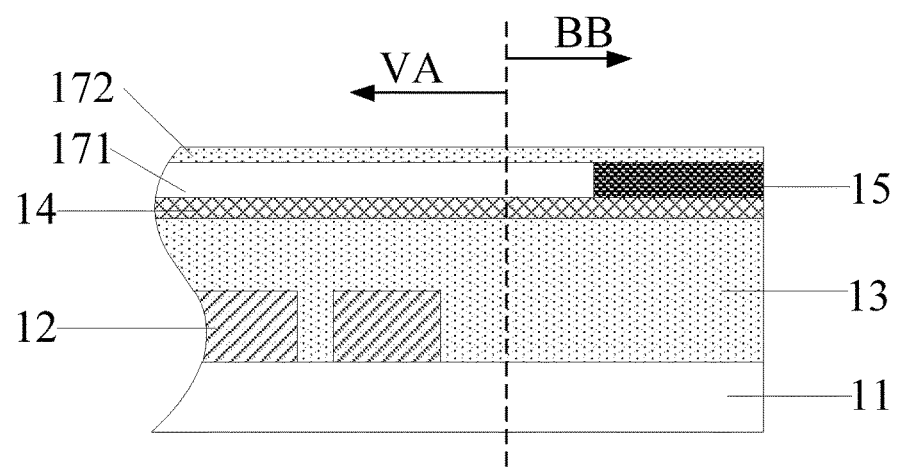
Figure 8C:
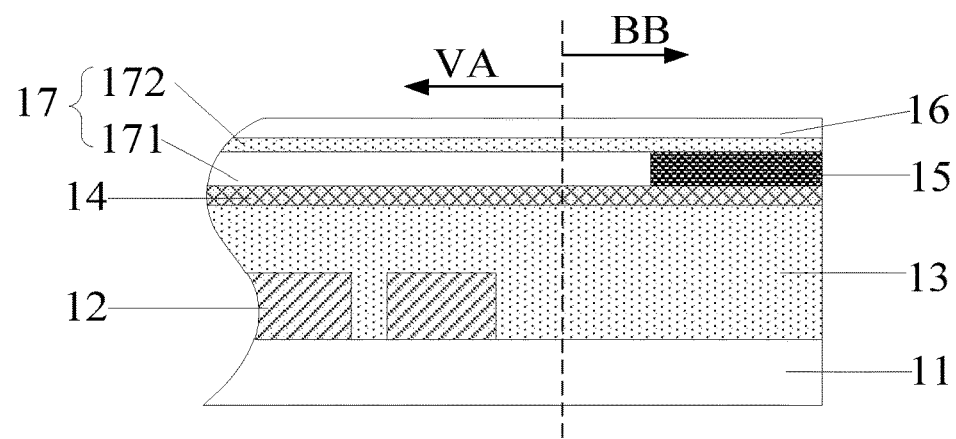

FIG. 8A to FIG. 8C are effect diagrams of the organic light-emitting diode display panel corresponding to the various steps in the method as illustrated in FIG. 7. After the display panel is fabricated in the structure as illustrated in FIG. 6D, as illustrated in FIG. 8A, firstly the first adhesive layer 171 can be formed on the surface of the touch electrode layer 14, and the height difference between the touch electrode layer and the peripheral circuit 15 can be filled up with the first adhesive layer 171 so that the thickness of the first adhesive layer 171 is equal to the thickness of the peripheral circuit 15; and in this way, as illustrated in FIG. 8B, after the second adhesive layer 172 is formed on the surfaces of the first adhesive layer 171 and the peripheral circuit 15, there are no gaps between the first adhesive layer 171 and the second adhesive layer 172, between the peripheral circuit 15 and the second adhesive layer 172, and between the first adhesive layer 171 and the peripheral circuit 15, and the surface of the second adhesive layer 172 is planar, so that after the circular polarizer 16 is adhered as illustrated in FIG. 8C, a gap or an air bubble can be completely avoided from occurring between the various layers in the display panel, to thereby improve the display quality.

Here the material of the first adhesive layer 171 can be an optically clear adhesive, and the material of the second adhesive layer 172 can be a pressure sensitive adhesive, although the embodiment of the disclosure will not be limited thereto.

In the organic light-emitting diode display panel, the method for fabricating the same, and the display device according to the embodiments of the disclosure, the organic light-emitting diode display panel is divided into a visible area and a non-display area around the visible area, and the organic light-emitting diode display panel includes: a base substrate, a plurality of organic light-emitting diode elements located on the base substrate, an encapsulation layer located on the sides of the organic light-emitting diode elements away from the base substrate, a touch electrode layer located on the side of the encapsulation layer away from the organic light-emitting diode elements, and a peripheral circuit located on the touch electrode layer away from the encapsulation layer, where the organic light-emitting diode elements are only located in the visible area, and the peripheral circuit is only located in the non-display area; and the organic light-emitting diode display panel further includes: a circular polarizer located on the sides of the touch electrode layer and the peripheral circuit away from the encapsulation layer, and an adhesive layer located between the touch electrode layer and the circular polarizer, where the touch electrode layer is firmly adhered with the circular polarizer through the adhesive layer. The adhesive layer can be made of an adhesive material with a high viscosity grade so that the circular polarizer can be firmly adhered with the touch electrode layer in a large area without any gap or air bubble in the visible area and at the edge of the visible area, to thereby avoid light from being leaked out of the display panel, so as to improve the display quality.

Although the preferred embodiments of the disclosure have been described, those skilled in the art benefiting from the base inventive concept can make additional modifications and variations to these embodiments. Therefore the appended claims are intended to be construed as encompassing the preferred embodiments and all the modifications and variations coming into the scope of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An organic light-emitting diode display panel, wherein the organic light-emitting diode display panel is divided into a visible area and a non-display area around the visible area; the organic light-emitting diode display panel comprises: a base substrate, a plurality of organic light-emitting diode elements on the base substrate, an encapsulation layer on sides of the organic light-emitting diode elements away from the base substrate, a touch electrode layer on a side of the encapsulation layer away from the organic light-emitting diode elements, and a peripheral circuit on a side of the touch electrode layer away from the encapsulation layer, wherein the organic light-emitting diode elements are only located in the visible area, and the peripheral circuit is only located in the non-display area; and the organic light-emitting diode display panel further comprises: a circular polarizer on sides of the touch electrode layer and the peripheral circuit away from the encapsulation layer, and an adhesive layer between the touch electrode layer and the circular polarizer, wherein the touch electrode layer is firmly adhered with the circular polarizer through the adhesive layer.

2. The organic light-emitting diode display panel according to claim 1, wherein a thickness of the adhesive layer at an edge of the visible area increases gradually in a direction from the edge of the visible area to the non-display area.

3. The organic light-emitting diode display panel according to claim 2, wherein a material of the adhesive layer is an optically clear adhesive or a pressure sensitive adhesive.

4. The organic light-emitting diode display panel according to claim 1, wherein the adhesive layer comprises: a first adhesive layer and a second adhesive layer stacked over each other, wherein the first adhesive layer is between the touch electrode layer and the second adhesive layer; and a thickness of the first adhesive layer is equal to a thickness of the peripheral circuit, orthographic projections of the first adhesive layer and the peripheral circuit on the base substrate are complement to each other, and an orthographic projection of the second adhesive layer on the base substrate covers the orthographic projections of the first adhesive layer and the peripheral circuit on the base substrate.

5. The organic light-emitting diode display panel according to claim 4, wherein a material of the first adhesive layer is an optically clear adhesive, and a material of the second adhesive layer is a pressure sensitive adhesive.

6. A display device, comprising the organic light-emitting diode display panel according to claim 1.

7. A method for fabricating the organic light-emitting diode display panel according to claim 1, comprising:

forming a plurality of organic light-emitting diode elements on a base substrate;

forming an encapsulation layer on sides of the organic light-emitting diode elements away from the base substrate;

forming a touch electrode layer on a side of the encapsulation layer away from the organic light-emitting diode elements;

forming a peripheral circuit on a side of the touch electrode layer away from the encapsulation layer;

forming an adhesive layer on surfaces of the touch electrode layer and the peripheral circuit away from the encapsulation layer; and adhering a circular polarizer to a surface of the adhesive layer away from the touch electrode layer;

wherein the organic light-emitting diode display panel is divided into a visible area and a non-display area around the visible area; and the organic light-emitting diode elements are only located in the visible area, and the peripheral circuit is only located in the non-display area; and the touch electrode layer is firmly adhered with the circular polarizer through the adhesive layer in the visible area.

8. The method according to claim 7, wherein a thickness of the adhesive layer at an edge of the visible area increases gradually in a direction from the edge of the visible area to the non-display area.

9. The method according to claim 7, wherein forming the adhesive layer on surfaces of the touch electrode layer and the peripheral circuit away from the encapsulation layer comprises:

forming a first adhesive layer on a surface of the touch electrode layer away from the encapsulation layer, wherein a thickness of the first adhesive layer is equal to a thickness of the peripheral circuit, and orthographic projections of the first adhesive layer and the peripheral circuit on the base substrate are complement to each other; and forming a second adhesive layer on surfaces of the first adhesive layer and the peripheral circuit away from the touch electrode layer, wherein an orthographic projection of the second adhesive layer on the base substrate covers the orthographic projections of the first adhesive layer and the peripheral circuit on the base substrate.

10. The method according to claim 9, wherein a material of the first adhesive layer is an optically clear adhesive, and a material of the second adhesive layer is a pressure sensitive adhesive.

\* \* \* \* \*